(12) United States Patent
Koduri

(10) Patent No.: US 8,358,014 B2
(45) Date of Patent: Jan. 22, 2013

(54) STRUCTURE AND METHOD FOR POWER FIELD EFFECT TRANSISTOR

(75) Inventor: Sreenivasan K Koduri, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 232 days.

(21) Appl. No.: 12/784,889

(22) Filed: May 21, 2010

(65) Prior Publication Data
US 2010/0301496 A1    Dec. 2, 2010

Related U.S. Application Data

(60) Provisional application No. 61/181,883, filed on May 28, 2009.

(51) Int. Cl.
- H01L 23/538    (2006.01)
- H01L 21/60     (2006.01)
- H01L 23/52     (2006.01)
- B44C 1/22      (2006.01)

(52) U.S. Cl. ........ 257/777; 257/578; 257/584; 257/670; 257/734; 257/735; 257/773; 257/774; 257/E23.001; 257/E23.01; 257/E23.141; 257/E23.169

(58) Field of Classification Search .................. 257/578, 257/584, 670, 734, 735, 773, 774, 777, E23.001, 257/E23.01, E23.141, E23.169
See application file for complete search history.

(56) References Cited

U.S. PATENT DOCUMENTS

| 2004/0061221 A1* | 4/2004 | Schaffer ........................ 257/723 |
| 2007/0273009 A1* | 11/2007 | Hauenstein ................... 257/666 |

* cited by examiner

Primary Examiner — Eugene Lee
Assistant Examiner — Peniel M Gumedzoe
(74) Attorney, Agent, or Firm — Steven A. Shaw; W. James Brady; Frederick J. Telecky, Jr.

(57) ABSTRACT

A packaged semiconductor device has a metal plate (1200) with sawed sides (1200c), a flat first surface (1200a) and a parallel second surface (1200b); the plate is separated into a first section (1201) and a second section (1202) spaced apart by a gap (1230). The plate has on the second surface (1200b) at least one insular mesa (1205) of the same metal in each section, the mesas raised from the second plate surface. The device further has an insulating member (1231), which adheres to the first plate surface, bridges the gap, and thus couples the first and second sections together. The device further has a vertical stack (1270) of two power FET chips (1210) and (1220), each having a pair of terminals on the first chip surface (1211 and 1212; 1221 and 1222 respectively) and a single terminal on the second chip surface. The single terminals of chip (1210) and chip (1220) are attached to each other to form the common terminal (1240). The terminal pair (1221) and (1222) is conductively attached to plate (1200) so that terminal (1221) contacts the first plate section (1201) and terminal (1222) contacts the second plate section (1202). The terminal pair (1211) and (1212) is available for attachment to a substrate.

12 Claims, 13 Drawing Sheets

STRUCTURE AND METHOD FOR POWER FIELD EFFECT TRANSISTOR

FIELD OF THE INVENTION

The present invention is related in general to the field of semiconductor devices and processes, and more specifically to the structure and fabrication method of power transistors with a terminal formed as packaging plate.

DESCRIPTION OF RELATED ART

An essential component of a large number of electronic apparatus is a power switch. To operate properly, a power switch not only needs to have high efficiency, but should preferably have small dimensions and very low cost. A popular power switch involves MOS Field Effect Transistors (FETs), which provide low resistance and can carry large amounts of current; they stay cool by dissipating heat effectively and thus can switch fast (fast transient response). As additional features, the market favors very thin and low cost FETs.

A typical power MOS FET has three terminals: The current flows between the Source and the Drain terminals, and the Gate terminal turns this flow on or off. It is common to produce these FETs in plastic molded packages, typically in Quad Flat No-Lead (QFN) or Small Outline Integrated Circuit (SOIC) configuration. Inside the package, the integrated circuit chip is assembled on the pad of a metallic leadframe and connected by bonding wires (usually for the gate) and clips (usually for the current-carrying source and drain) to the leads.

The usage of bonding wires or ribbons, necessitating protection in a relatively bulky plastic package, can be avoided by an all-flat assembly design. For that configuration, gate and source terminals on one side of the chip are face-down attached (soldered) to copper tracks on the printed circuit board (PCB), while the drain is connected by chip attach material to a copper clip. The clip, in turn, is formed by bending as a can in order to allow encapsulation of the chip into a copper housing and attachment of the clip to the PCB outside the chip, the drain and can facing upward. The chip needs to be passivated for isolating the gate and source terminals and for acting as a solder mask in the attachment step to the PCB; in addition the passivation layer has to protect the terminals from moisture and contamination.

SUMMARY OF THE INVENTION

Applicant recognized that the market trends in electronic devices, which incorporate power switches, demand thin, light weight and low cost products, amenable to integration with stacked chips of field effect transistors (MOSFETs) and parts such as capacitors and inductors. As a consequence, the structure of the packages for the power switches has to be compatible with mounting the FETs by single terminal, by two terminals, and as stacked chips. The packages further have to be flexible with regard to footprint and layout on printed circuit boards (PCBs); in addition, the fabrication needs to be simple, very low cost, and amenable for attaching heat sinks.

Applicant found that the use of metal cans formed for specific chip sizes is too inflexible for permitting the assembly and packaging of inverted MOSFET chips or of stacked chips. Furthermore, the footprint of pre-formed cans consumes too much area of the ever more crammed and valuable PCBs. The metal thickness required for the cans makes it difficult for the packages to reach ever lower values of parasitic electrical parameters such as inductance.

Applicant discovered that the problem of a low cost package for an inverted MOSFET, and for two MOSFETs stacked as a power switch, can be solved by a metal plate with a flat first surface, a parallel second surface, and insular mesas of the same metal raised from the second surface. The metal plate is fabricated by a batch process starting with a flat metal sheet; the spots for the future mesas are masked and the un-masked surface is etched to a new lower parallel surface. The etching step for this second surface transforms the masked spots into insular mesas rising from the second surface. After attaching the MOSFETs, the sheet is sawed into discrete units each including a rectangular plate with an attached MOSFET. The units can then be flipped to connect the un-attached MOSFET terminals as well as the mesas to the PCB.

When the drain terminal of a MOSFET is conductively attached to the second plate surface, the transistor source and gate terminals remain un-attached to the plate and available to be flipped for attachment to the PCB. On the other hand, in order to attach the source and gate terminals of a MOSFET, the plate for each unit is separated into two sections spaced apart by a gap, yet coupled together by an adhesive member on the first surface. During the assembly of a MOSFET, one of the sections is connected to the source terminal and the other section to the gate terminal; the transistor drain terminal remains available for connection to the PCB.

When a first and a second FET are to be connected as a power switch, the drain terminal of the first FET is connected to the source terminal of the second FET to form the common terminal. When the FETs are configured laterally on a plate un-separated into sections, the plate acts as the common terminal. When the FETS are configured vertically, the source terminal of the first FET contacts the first plate section and the gate terminal of the first FET contacts the second plate section, while the drain and gate terminals of the second FET remain un-attached to the plate, but are available for connection to the PCB.

It is a technical advantage that a power switch with stacked FETs not only saves PCB area, but can also be produced with thin contours so that parasitic electrical parameters are minimized and electrical characteristics such as device speed can be maximized.

It is another technical advantage that the stacked configuration of the FETs can be produced as a power switch wherein the common terminal features an independent connection to the PCB. This connection can be utilized to attach an external part such as an energy storing inductor in an integrated manner, producing the type of compact power switch device, which the market requires.

As yet another technical advantage, an FET assembly with the gate on top, and a stacked FET assembly, allow an easy visual inspection of the PCB assembly, providing a welcome improvement for process control.

It is a further technical advantage that the size of the insulated mesas of the FET plate can be extended by selective partial etching from both sides of the plate. Extended mesas not only can provide better quality control at surface mount to the PCB, but also reduce the stress in the joints of the board-assembled FET, thus enhancing the reliability of the power FET.

It is another technical advantage that the FET chips can be produced as hermetic units, rendering the power switch device moisture insensitive.

DETAILED DESCRIPTION OF THE PREFERRED EMBODIMENTS

Figure 1:
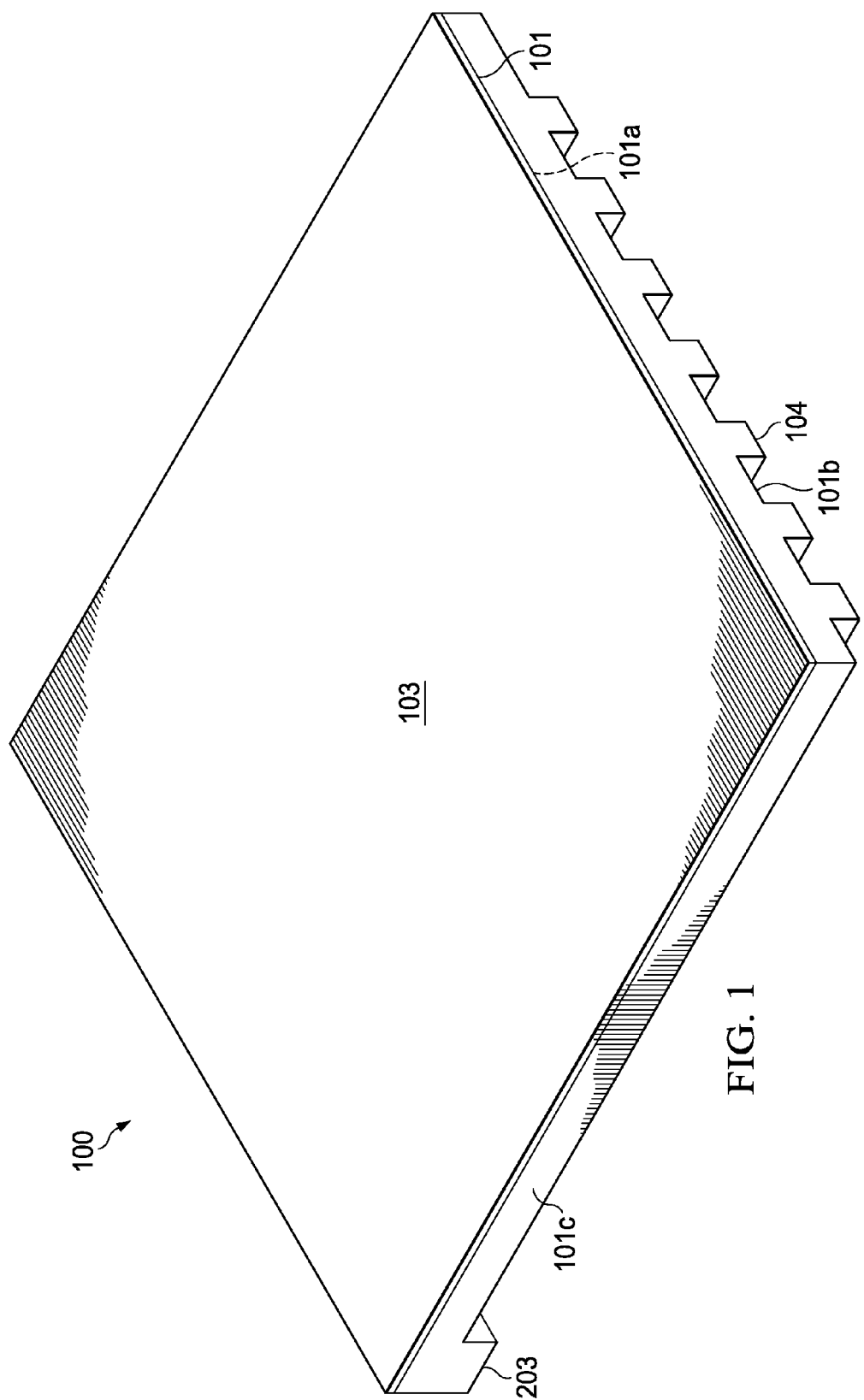
FIG. 1 is a perspective view of the top of a power field effect transistor (FET) packaged according to the invention, the first surface of the package metal plate having a layer for device symbolization.

FIG. 1 depicts an exemplary packaged power field effect transistor (FET), generally designated 100, as an embodiment of the invention. The package includes a metal plate 101 with sawed sides 101c. The preferred metal is copper or a copper alloy; alternatively, aluminum or other metals or compounds with good electrical and thermal conductivities may be used. In the example of FIG. 1, the sides 101c form a square; in other examples, plate 101 may have a rectangular perimeter or any other geometrical outline, which can be sawed from the starting metal strip. The perspective view of FIG. 1 shows the first surface 101a of the plate, indicating that surface 101a is flat to the side corners. In the example of FIG. 1, surface 101a is actually covered by a layer 103 made of a material suitable for device symbolization; exemplary materials include black-colored polymeric compounds based on an epoxy or polyimide formulation.

FIG. 1 further indicates at least one metal mesa 104 protruding from second plate surface 101b. In the transistor example of FIG. 1, a plurality of mesas 104 are linearly arrayed along one perimeter portion of the rectangular plate 101. In other devices, the mesas may be arbitrarily distributed. Mesas 104 are made of the same metal as plate 101; as the fabrication method explains (see below), mesas 104 are raised from second plate surface 101b by the etching process of the starting plate. Consequently, if an exemplary plate 101 is made of a copper alloy, the mesas are made of the same copper alloy.

Figure 2:
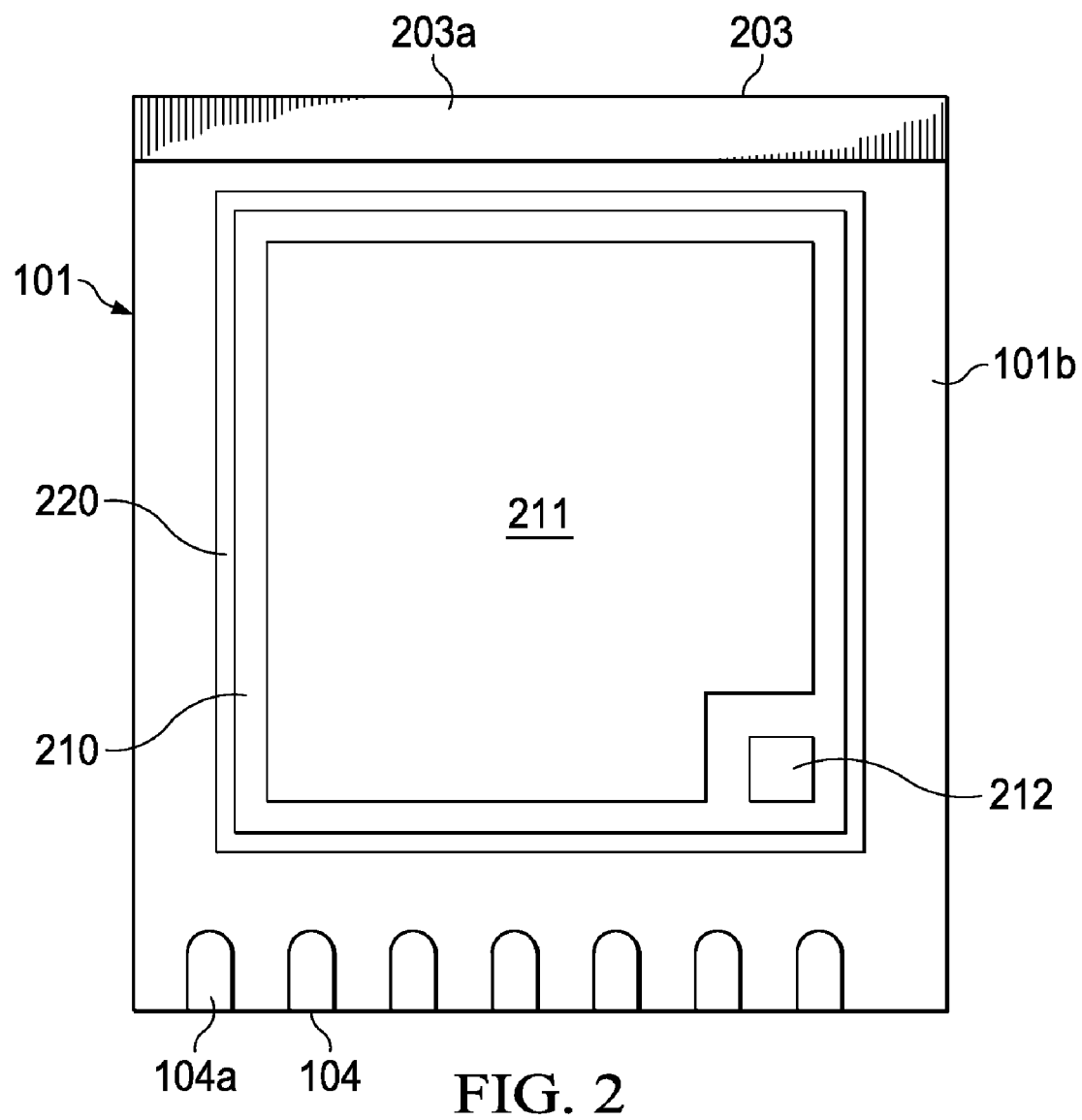
FIG. 2 shows a bottom view of the packaged power FET of FIG. 1, the view displaying the second surface with the insular mesas of the package metal plate, and the source and the gate terminals of an FET chip assembled on the plate according to an embodiment of the invention.

FIG. 2 shows the bottom view of the packaged power FET displaying the second surface 101b of the plate of the packaged FET, a portion (surface) 210 of the transistor chip, and the attachment layer 220 of the chip. The second surface 101b of the plate is parallel the first surface 101a and, consequently, flat. Further shown in FIG. 2 is a plurality of insular mesas 104, which serve as connection pads for contacting plate 101. In the device example of FIG. 2, the insular mesas are arrayed linearly along one perimeter portion of plate 101. As FIG. 1 indicates, each insular mesa 104 rises from second plate surface 101b and is composed of the same metal as the plate. FIG. 2 illustrates that the mesas 104 have a flat top 104a; the plurality of the mesa tops, or surfaces 104a lie in a plane, which herein is referred to as the third surface of the packaged power FET (for its significance in the plate fabrication see below).

In the package example of FIG. 2, plate 101 has a linear metal ridge 203 extending along a perimeter. Ridge 203 has a flat top, like the mesas have, and a height equal to the height of the mesas. As a consequence, the surface 203a of ridge 203 is in the same plane as the surfaces 104a of the mesas and thus belongs to the third surface of the packaged power FET. The long narrow elevation 203 is raised from second plate surface 101b like the mesas 104; as the edge of ridge 203 visible in FIG. 1 shows, ridge 203 is made of the same metal as the plate. The purpose of ridge 203 is to protect the assembled semiconductor device; consequently, the height of ridge 203 is, in the preferred embodiment, equal to the height of the assembled device. In other package examples, the plate may have no ridge or more than one ridge; for example, there may be a ridge along each perimeter side, forming a frame around the assemble semiconductor device.

As mentioned, plate 101 and thus mesas 104 and ridge 203 are preferably metallic, for example made of copper or aluminum. It is advantageous for many device applications to have the plate metal in a solderable metallurgical configuration. As an example, the plate metal surface may be covered by one or more layers of solderable metal, such as a layer of nickel followed by an outermost layer of palladium or gold.

In the example of FIG. 2, the semiconductor device assembled on the flat second plate surface 101b is a power field effect transistor (FET). The assembled chip is designated 210. The FET has a pair of terminals on the first chip surface and a single terminal on the second chip surface. In FIG. 2, the single FET terminal, frequently the transistor drain, is attached to second plate surface 101b by attachment layer 220 and therefore not visible. The terminal pair is unattached to the plate and thus visible in FIG. 2. The large contact area 211 of the pair is frequently the source terminal of the transistor; the smaller area 212, separated and insulated from area 211, is frequently the transistor gate terminal. Source terminal 211 and gate terminal 212 are electrically and thermally conductive; preferably, they are made of a solderable metal (for example, copper or aluminum, covered with a layer of nickel and an outermost layer of palladium or gold).

It should be pointed out that the package structure of the invention offers significant flexibility of placing the gate terminal 212 in chip locations of low thermomechanical stress, such as close to the center of the chip, or close to the middle of a chip side. Based on finite element stress modeling for selected materials and geometries, the preferred location of the gate terminal can be determined in relation to the neutral point under coefficient-of-thermal-expansion mismatches. In addition, the package structure of the invention offers geometrical flexibility for avoiding package warpage and delamination.

In the assembly of the packaged power FET to a substrate or printed circuit board (PCB), the pre-fabricated plate 101 is flipped so that second plate surface 101b faces the substrate. The surfaces 104a of the mesa-shaped plate terminals 104 can then be conductively attached (for instance by soldering) to respective pads of the substrate, preferably in one process step together with conductively attaching FET terminals 211 and 212 to their respective substrate pads. It is optional to also conductively attach the surface 203a of ridge 203 to the substrate in the same process step.

In the preferred assembly method, the step of conductively attaching includes the step of depositing a layer 220 of conductive attach material onto the second plate surface 101b; the conductive attach material is selected from a group including adhesive polymeric compounds such as a silver-filled epoxy formulation, solder alloys such a tin-silver eutectic or a gold-germanium eutectic, and adhesive pastes with conductive filler particles such as carbon nano-tubes. In the next process step, a terminal of the semiconductor device, for instance the drain, is pressed onto the attach layer. For reasons of manufacturability and device reliability, it is preferred to assemble chip 210 so that the surfaces of terminals 211 and 212 are substantially (i.e., within ±12 μm) coplanar with the coplanar surfaces 104a and 203a. If the goal of coplanarity is difficult to manufacture, the protection of the chip favors a configuration, wherein the surfaces 104a and 203a are slightly higher than the surfaces of terminals 211 and 212.

Figure 3:
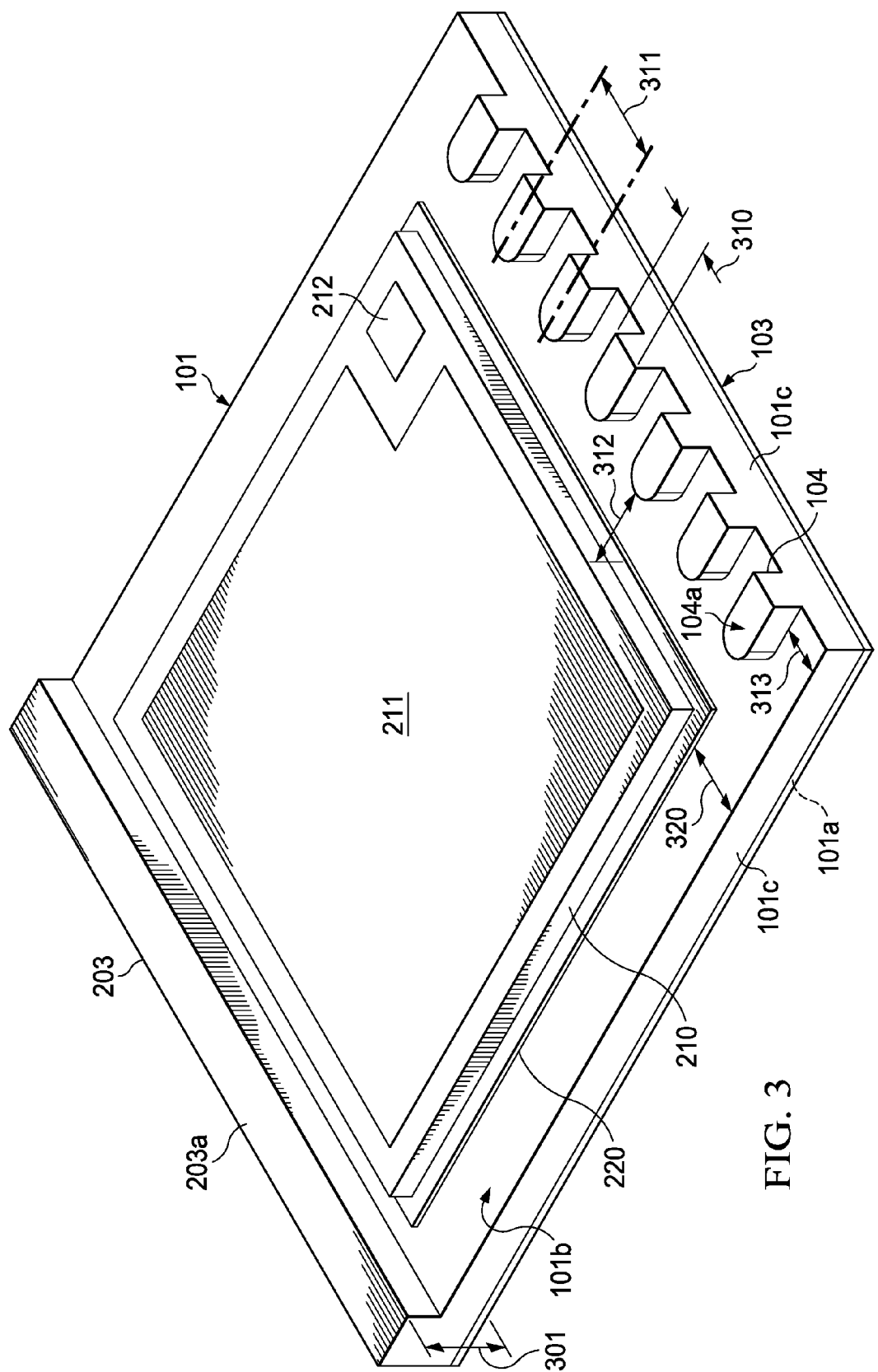
FIG. 3 illustrates a perspective view of the power FET of FIGS. 1 and 2, the FET assembled on the package metal plate according to the invention.

FIG. 3 summarizes the structure of the packaged power FET, viewed from the bottom side, and illustrates certain steps of the process flow for fabricating the package plate 101. The sequence of the fabrication process steps is displayed in FIG. 4. The plate 101 of a first metal, displayed in FIG. 3, is the singulated plate for a discrete power chip 210. It is economical for the fabrication process flow to start in step 401 (see FIG. 4) with the first metal selected in the configuration of an elongated sheet or strip, which will be singulated for instance by sawing, or punching into discrete plates during the last step 409 of the following process flow. The sheet has a flat first surface and a parallel opposite surface, which has been referred to as the third surface in the above FET description. In FIG. 3, the first surface of the plate is designated 101a, but is actually hidden. As described above, the parallel opposite sheet surface, the so-called third surface, is indicated by the surface 203a of ridge 203 and the surfaces 204a of mesas 104. Preferred sheet materials are metals such as copper and aluminum, or alloys thereof, or any other alloy or compound with high electrical and thermal conductivity. The starting sheet has a thickness 301 (see FIG. 3) preferably between about 150 and 500 μm; alternatively, thinner metal sheets may be employed, or sheet thicknesses up to 1200 μm or even more.

As stated, the metal sheet is selected so that a plurality of sites can be batch-fabricated simultaneously, wherein each site is to become an individual plate for assembling a semiconductor device. The next process step 402 is optional; for some devices, the step includes the process of coating the first sheet surface 101a with a thin insulating layer 103 suitable for symbolization, which may contain information of device type, origin, and fabrication. For many devices, a preferred coating technique includes a spin-on method of a low viscosity polymeric compound, for instance based on an epoxy or polyimide formulation, which is later polymerized into a hard layer. Other coating techniques include printing, dispensing, painting, molding, and film attaching. The layer has preferably a dark or black color so that it can be inscribed by a laser technique to create contrasting, easily readable symbols, letters and numbers for the device characterization. Another method of creating a package surface for contrasting symbolization is anodizing the sheet metal; this method is particularly preferred for aluminum-based sheets.

For other devices, intended for the "gate-up" assembly discussed below, step 402 includes the process of adhesively attaching a insulating member layer (designated 1031 in FIG. 10), which adheres to the first plate surface 101a and is suitable to bridge intended gaps between sheet metal sections (see step 405), thus coupling the sections together. The material of member 1031 may be a layer of polymeric molded and hardened compound, or an adhesive chemically inert polymer; it is preferred that the material of member 1031 is suitable for symbolization.

In the next process step 403, discrete assembly sites are selected on the metal sheet. A photoresist layer is deposited over the entire sheet and patterned so that the plurality of sites is defined. A photomask further masks for each site one or more spots of the third sheet surface to become the future insular mesas and ridges, while the remaining portions of the third sheet surface area are left unmasked. These spots of each site will become the surfaces 104a of the mesas and the surface 203a of the ridge shown in FIG. 3. For the power FET package in FIG. 3, a plurality of mesas are depicted; their actual number is a function of the transistor type and the assembly requirements onto the PCB. For reasons of manufacturability, assembly, and device reliability, the width 310 of the mesas is selected wide enough to allow some mesa undercutting in the etching step (see below). As examples, elongated mesas of 200 by 200 μm side length, and round mesas of 200 μm diameter have been manufactured. The distance 311 between adjacent mesas, and the distance 312 between the mesas and the assembled chip are selected far enough (for instance about 200 μm) to prevent shorting by solder reflow in the PCB assembly process (see below). The distance 313 of the nearest mesa to the adjacent plate edge, and the distance 320 of the assembled chip to the adjacent plate edge are selected to allow space for the saw street during the metal sheet singulation process (see below).

In step 404, the un-masked remaining portion of the third sheet surface is etched, preferably by a chemical method which attacks and removes the exposed sheet metal in constant, uniform manner. This etching step creates the second sheet surface 101b as a flat surface parallel to first surface 101a, and concurrently transforms the masked spots into the insular mesas 104 and ridge 203, which thus rise from the second surface 101b and are made of the same metal as the sheet. The depth of the etching is preferably about 50±20% of the sheet starting thickness 301. Based on this etching methodology, the insular mesas as well as the ridge have substantially the same height as measured from the newly formed flat second surface 101b.

In optional step 405, applicable to metal sheets backed up by the insulating member layer 1031 and intended for "gate-up" assembly, a patterned photoresist layer is used to separate each assembly site area into two sections, which may have unequal or equal size. The separation is accomplished by etching narrow regions, preferably straight lines, of the second sheet surface 101b, until all metal in the narrow regions is removed, the coupling insulating member layer 1031 underneath the metal is reached, and a gap between the metal sections is formed. An exemplary gap, designated 930, depicted in FIGS. 9 and 10. By this process step, each assembly site is separated into as first and a second section.

In order to insure that the second surface 101b and the surfaces 104a of the mesas and the surface 203a of the ridge are solderable, it is preferred for many device applications to continue with step 406, wherein a thin layer of a second metal is deposited onto the second sheet surface, the insular mesas and the ridge. The preferred deposition method is plating. Dependent on the first metal, the second metal may include one or more thin layers of second metals. As an example, when the first metal includes copper, a successful second metal layer includes the deposition of a thin layer of nickel on the copper followed by an outermost thin layer of palladium or gold on the nickel.

The next process steps concern the assembly of a semiconductor device onto each site of the sheet. In step 407, a layer 220 of electrically and thermally conductive attach material is deposited onto the second surface of each site so that layer 220 neighbors the insular mesas of the site. An example of a layer 220 neighboring the mesas of an assembly site is depicted in FIG. 3. A suitable conductive attach material is selected from a group including adhesive polymeric compounds (for instance a conductive polyimide-based or epoxy-based formulation), adhesive pastes with conductive filler particles (for instance selected from silver, copper, gold, and tin), and solder alloys (for instance a eutectic tin-silver alloy, eutectic gold-germanium alloy). The adhesive polymeric materials are preferably deposited in semi-viscous precursor formulations, which, after assembly, have to be hardened by polymerization at elevated temperatures.

In step 408, a terminal of a semiconductor device is attached onto each attach layer 220. In the example of FIG. 3, the single terminal on one surface of a power FET chip, often the drain terminal, is attached to layer 220, leaving the pair of terminals on the other chip surface, often the source terminal 211 and gate terminal 212, un-attached. In the preferred attach method, the drain terminal is pressed onto the attach layer; thereafter, the polymeric adhesive materials have to be hardened and the solder alloys have to be reflowed at the respective eutectic temperature.

After the attachment of the semiconductor chips, the metal sheet is singulated into discrete device units in step 409. The preferred method is a sawing technique, wherein a rotating disc, studded with sapphires or diamonds around its perimeter, cuts lines (usually straight lines) through the metal sheet. As a consequence, a discrete packaged power FET, exhibits at least one sawed side 101c of the package plates. In the FET example shown in FIG. 3, all four sides of the plate have been sawed (a different example is discussed in FIG. 6). Other singulation techniques include chemical etching, laser cutting, scribing and breaking, water jetting, and breaking by liquid nitrogen jet. Besides the assembled chip 210, each discrete device unit includes at least one insular mesa 104.

Figure 5:
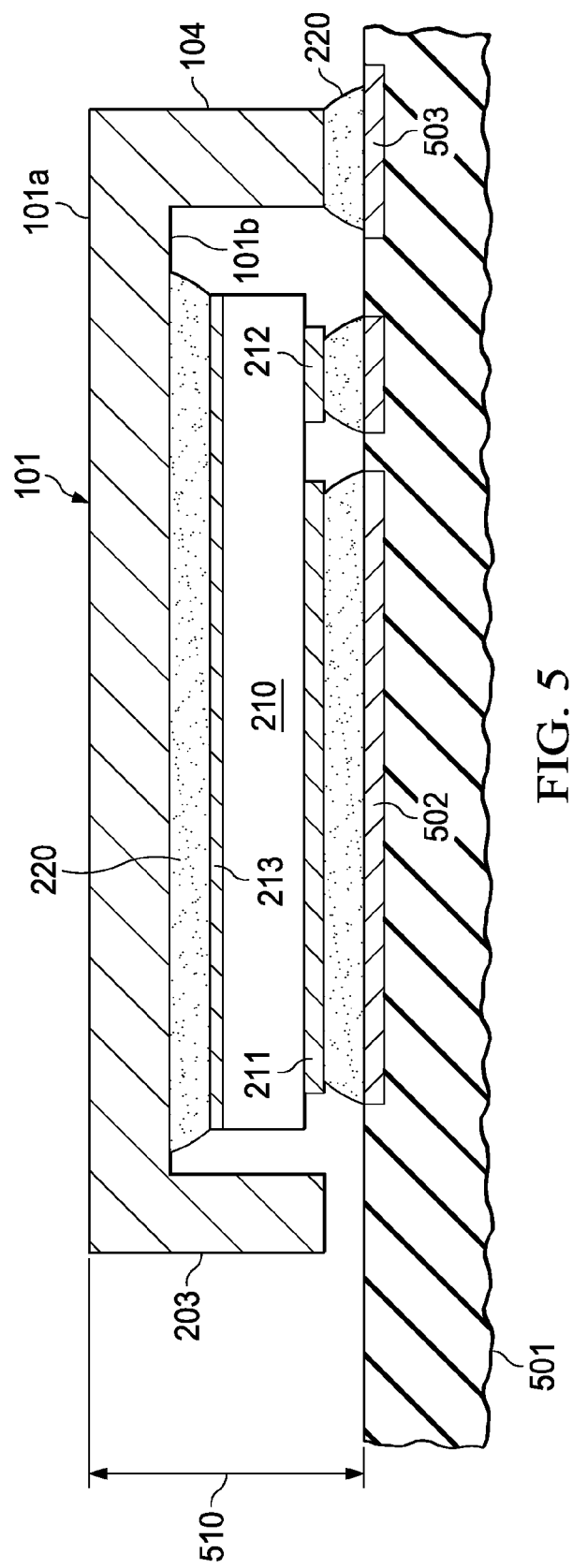
FIG. 5 is a schematic cross section of a power FET, packaged according to an exemplary embodiment of the invention and assembled with the transistor source and gate and a mesa of the plate on a printed circuit board (PCB).

FIG. 5 illustrates the assembly of an exemplary packaged power FET onto contacts pads 502 of a printed circuit board (PCB) 501. In the example shown, the drain terminal 213 of FET chip 210 is attached by attach material 220 onto metal plate 101, and the source terminal 211 and the gate terminal 212 are attached by attach material 220 onto a respective pad 502 of PCB 501. This assembly structure is herein referred to as "gate down" board assembly. As mentioned above, a preferred attach material 220 is a solder alloy. The same attach material 220 may be used to connect the mesas 104 of the package plate 101, and thus the FET drain terminal, with pads 503 of the board. Ridge 203 of plate 101 is not connected to the board in the example of FIG. 5, but in other devices it may be connected to the board.

In the assembled exemplary packaged FET of FIG. 5, the height of the metalized FET chip may be between about 50 and 125 µm; the height of mesa 104 may be between about 100 and 300 µm, the same as the plate 104 itself; the thickness of the attach material may be between about 10 and 50 µm. In summary, the total height of the assembled packaged FET may be between about 110 and 350 µm.

For specific device needs, the assembly structure of the packaged FET of FIG. 5 may be modified in various ways. As an example, ridge 203 may be omitted in order to provide space to insert an electronic component between the second surface 101b of plate 101 and the PCB without increasing the height 510 of the assembled power FET. Examples of electronic components include diodes, filters, electrostatic discharge protection devices, capacitors, and sensors. Using traces of the PCB, the inserted components may thus be connected between transistor source 211 and drain 213.

As another example, using a thermally conductive attach material such as a silver-filled epoxy compound, an external heat spreader with a comb-like fin structure may be attached to first surface 101a of metal plate 101. As a massive enough structure, the heat spreader may also function as a heat sink so that the thermal path from the FET drain terminal, attached to second plate surface 101b, through the plate thickness into the heat sink attached to first plate surface 101a is minimized.

As yet another example, when the starting metal sheet for the plate is thick enough, a portion of the plate thickness can be used to etch fins for a heat spreader over the length of plate 101. In this case, the first surface 101a of plate 101 can act as an effective built-in heat sink for the FET drain terminal, which is attached to the second surface 101b of plate 101.

Figure 4:
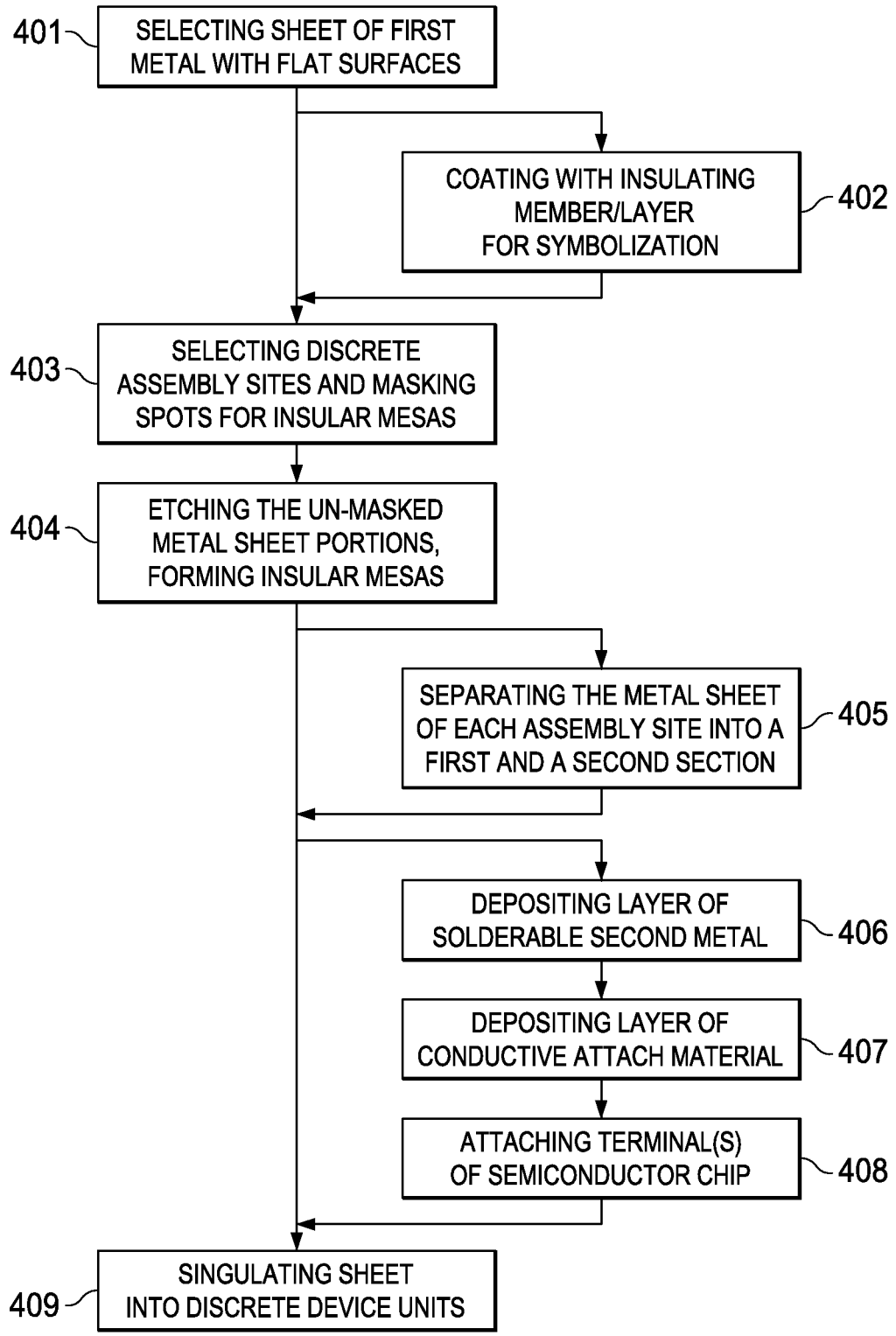
FIG. 4 shows schematically steps of the process flow for batch-fabricating metal plates used in packaging power FETs, and for assembling FETs.
Figure 6:
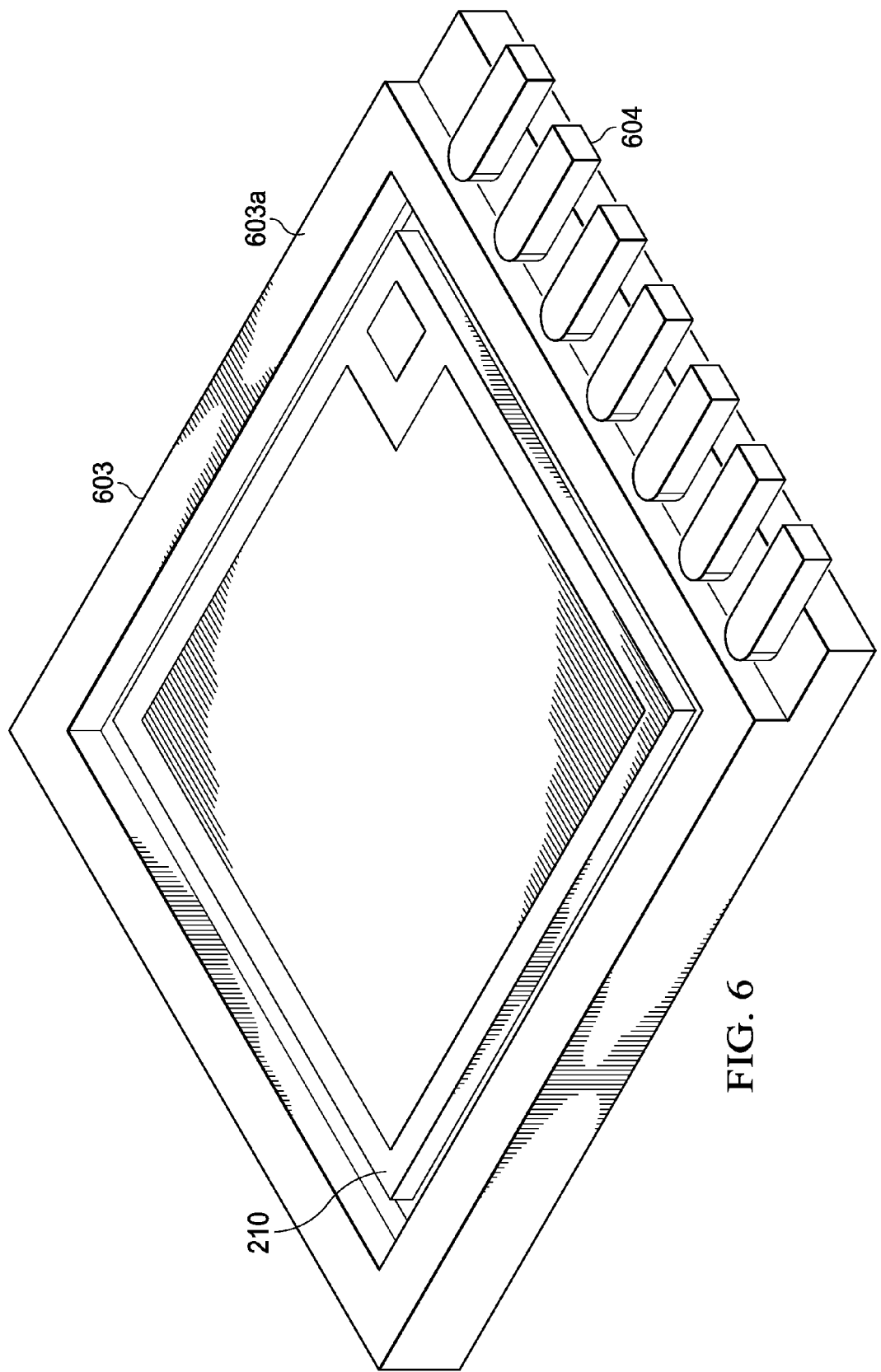
FIG. 6 shows a perspective view of another embodiment of the invention, a packaged power FET with extended insular mesa areas of the metal plate.

FIG. 6 illustrates variations of the power FET package shown in FIG. 3. The package variations include extended plate terminals 604, and ridges 603 fully encircling the chip. The extended terminals 604 can be manufactured by selectively partial-etching the sheet metal from both sides of the sheet (the process step 403 in FIG. 4 is replaced by a more detailed step). Extended terminals can provide better quality control at surface mounting the FET package to the PCB. Extended terminals further can improve board level reliability by relieving some thermomechanical stress exerted to the attach material in the joints, especially when the extension is large enough to allow some curving or spring-like forming of the extended terminal.

Ridges 603 fully encircle chip 210 and thus provide a frame for the chip. When surface 603a of ridges 603 is solderable, the whole frame can be attached to the PCB by a moisture-impermeable solder, thus creating a fully hermetic package for chip 210.

Figure 7:
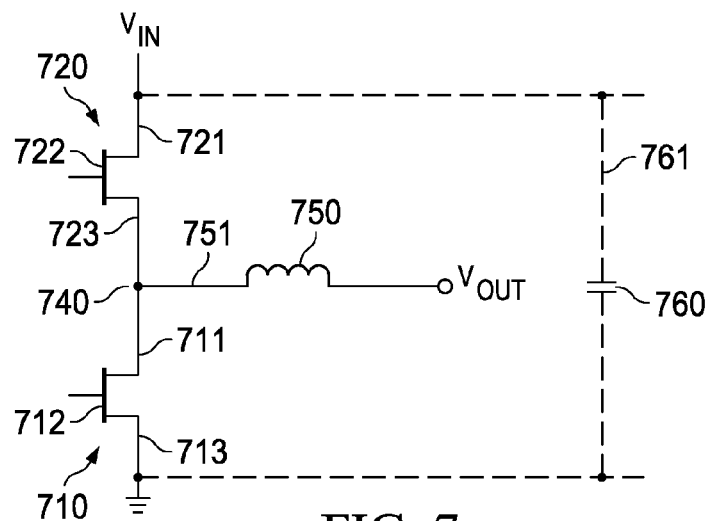
FIG. 7 is a circuit diagram of a Half Bridge for power supplies including two coupled FETs and a capacitor.

The circuit diagram FIG. 7 illustrates a Half Bridge used in Power supplies, wherein a first field effect transistor is coupled with a second FET and an inductor. The second FET 720 has its source 721 connected to the input voltage $V_{in}$ and its drain 723 coupled to the source 711 of the first FET 710. The drain 713 of FET 710 is at ground potential. The gate 722 of FET 720 and the gate 712 transistor 710 are operated by a gate driver (not shown in FIG. 7), which in turn is regulated by a controller (not shown in FIG. 7). The common connection between source 711 and drain 723 operates as the switch, designated 740.

Figure 13:
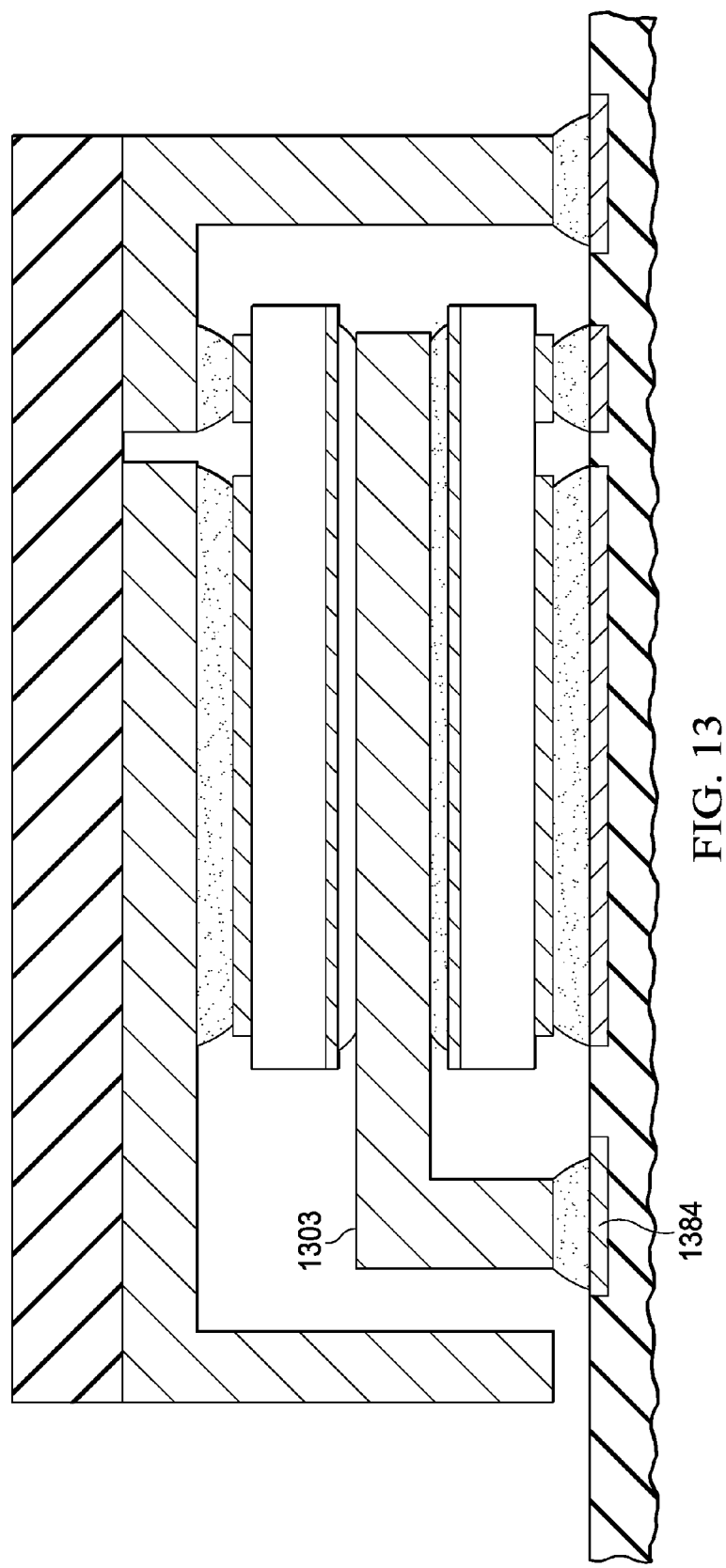
FIG. 13 is a schematic cross section of another embodiment of the invention, wherein the common terminal of stacked and packaged chips can be accessed.

In a DC-DC power supply circuit, indicated by solid lines 751 in FIG. 7, common connection 740 is coupled to an inductor 750 serving as the energy storage of the power supply circuit; the inductor has to be large enough to reliably function for maintaining a constant output voltage $V_{out}$. Employing a vertical stacked coupling of the first and second transistors, an exemplary structure of the DC-DC power supply circuit is shown in FIG. 13.

Figure 8:
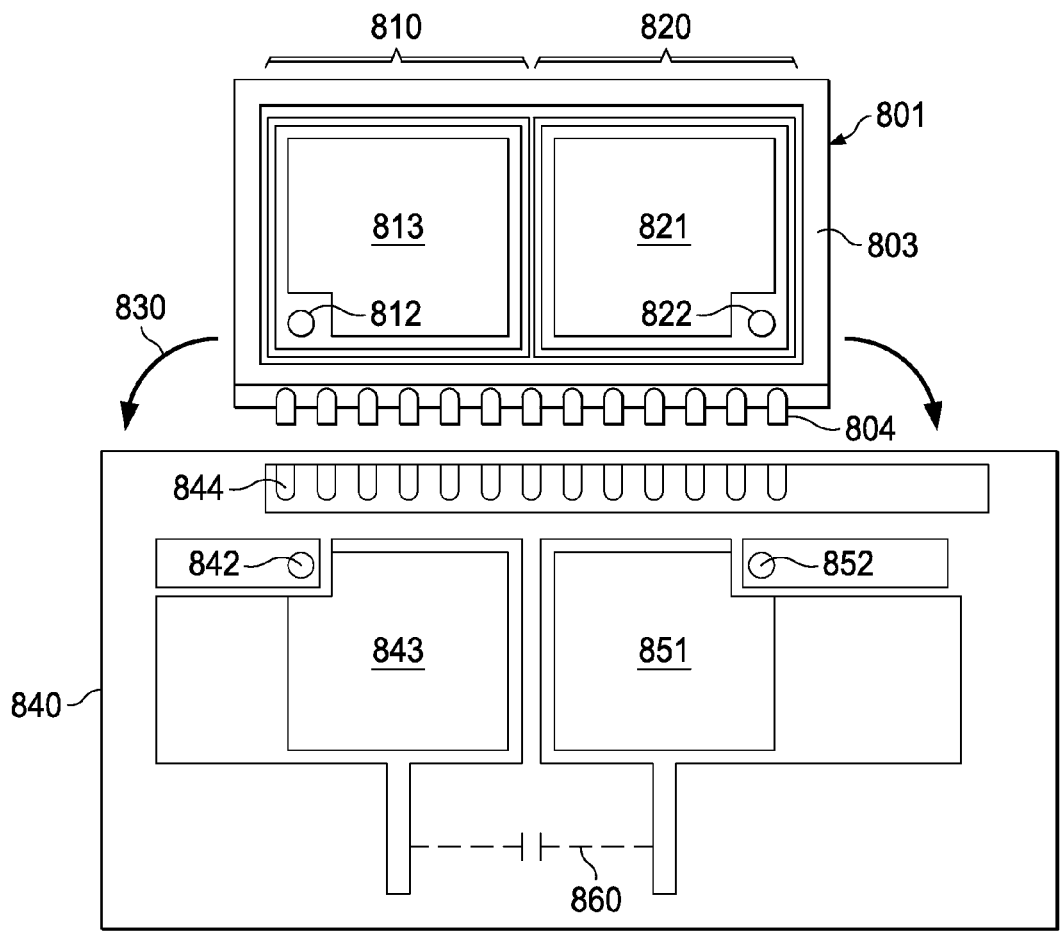
FIG. 8 illustrates the top view of a PCB with attachment pads for the terminals of two FETs assembled horizontally on a metal plate with insular mesas according to the invention.

Another circuit application is indicated by the dashed lines 761 in FIG. 7. In this application, a capacitor 760 is connected between $V_{in}$ and ground. A realization of this circuitry is depicted in FIG. 8. An elongated metal plate 801 serves as the common terminal of a first FET 810 and a second FET 820 placed horizontally next to each other. Plate 801 is structured, similar to the example shown in FIG. 6, with extended terminals 804; it also exhibits the ridges 803 as a full frame. In order to use plate 801 as the common terminal coupling the two transistors, the source of transistor 810 (source not shown in FIG. 8) and the drain of transistor 820 (drain not shown in FIG. 8) are attached onto the plate 801. Consequently, drain 813 of transistor 810 and source 821 of transistor 820 are visible in FIG. 8, together with gates 812 and 822.

Arrows 830 indicate how plate 801 will be flipped onto PCB 840 so that the visible FET terminals 812, 813, 821, and 822 line up with the respective contact pads 842, 843, 851, and 852 of the board. The paired terminals and pads are than connected, preferably by solder or by a conductive adhesive. In the same process step, plate terminals 804 are connected to the respective contact pads 844 of the PCB, preferably by solder (if a fully hermetic encapsulation of the transistors is desired) or by a conductive adhesive (if a semi-hermetic encapsulation of the transistors is sufficient). If a respective contact frame has been provided on PCB 840 (not shown in FIG. 8), it is preferred to connect plate frame 803 to the PCB's contact frame in the same process step. Pad 851, connected to source terminal 821 of transistor 820, is coupled to input voltage $V_{in}$ and pad 843 is at ground potential. On the PCB, a capacitor 860 is connected between $V_{in}$ and ground. The advantage to place both transistors 810 and 820 horizontally close to each other on the common plate 801, allows the user to optimize the layout of the PCB routing electrically.

It is a technical advantage of the invention that more than two transistors may be placed on a common plate, simplifying the packaging of the system and the design of the PCB traces, and optimizing the electrical system performance.

Figure 9:
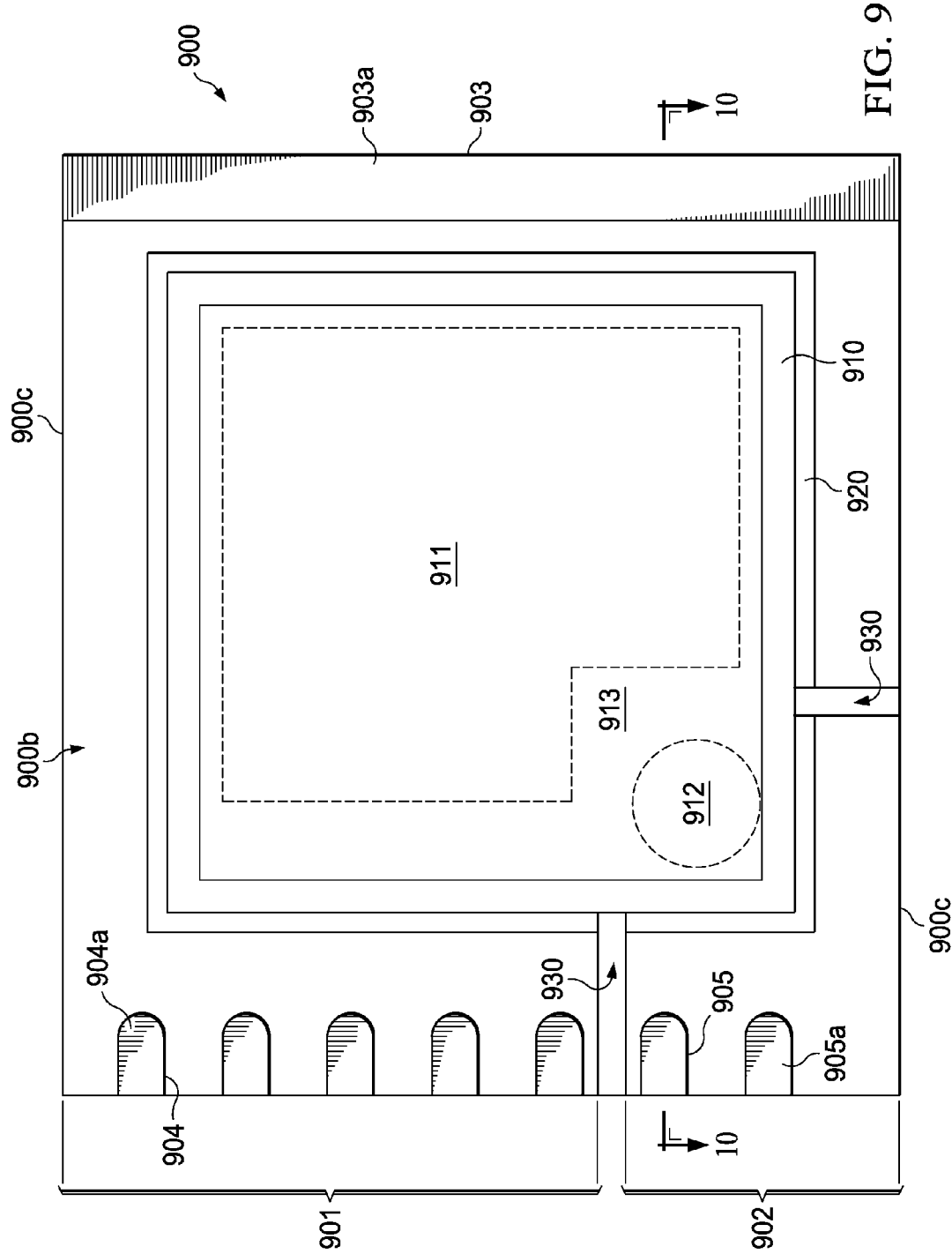
FIG. 9 depicts a bottom view of a packaged power FET according to another embodiment of the invention, wherein the package plate is separated into a first and a second section spaced apart by an insulating gap yet coupled together by an insulating member adhering to the first plate surface.
Figure 10:
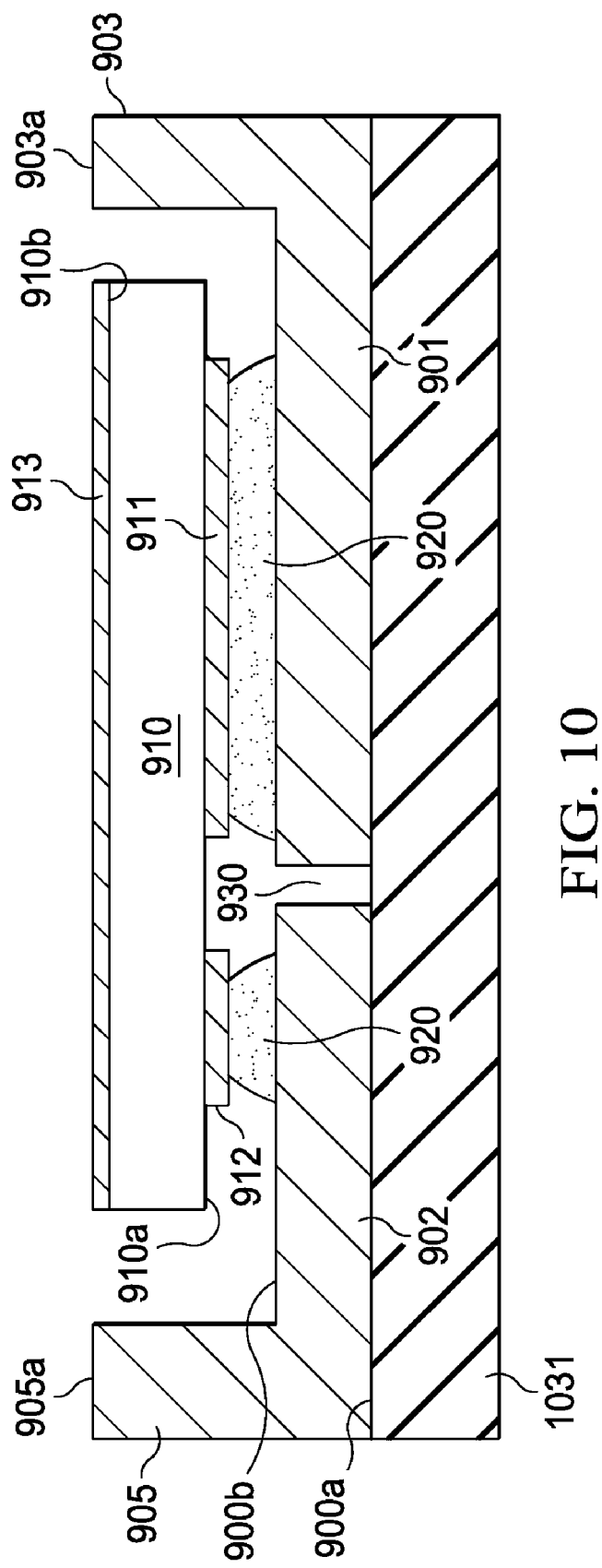
FIG. 10 shows a schematic cross section (not to scale) of the power FET of FIG. 9; the source terminal is attached to first plate section and the gate terminal is attached to the second plate section.

For simplifying the transistor assembly process and for standardizing and simplifying the layout of the board, it is for many applications desirable to connect only the drain terminal of an FET to the board and handle the more complex source and gate terminal assembly during the efficient device packaging flow. This modification, herein referred to as "gate up" board assembly, can be accomplished by another embodiment of the invention: The separation of the metal plate into a first and a second section spaced apart by a gap, but coupled together by an insulating member adhering to the plate. FIGS. 9 and 10 illustrate the embodiment.

FIG. 9 illustrates the bottom view of a packaged device comprising the FET chip 910 attached by layer 920 onto a metal plate generally designated 900. FIG. 9 actually depicts the second surface 900b of plate 900, while the first surface 900a, not shown in FIG. 9, is indicated in the cross section of FIG. 10. First surface 900a is flat; since surface 900b is parallel to surface 900a, surface 900b is also flat. As FIG. 9 illustrates, plate 900 is divided into a first section 901 and a second section 902 separated by an insulating gap 930. As FIG. 10 shows, the gap is bridged by an insulating member 1031, which adheres to the first surface 900a of the plate and couples first plate section 901 and second plate section 902 together. As an example, insulating member 1031 may be a sheet of a polymeric molded and hardened compound or an adhesive layer of a chemically inert polymer, preferably in the thickness range from about 100 to 800 µm. It is a technical advantage to select the material for the member so that its surface allows the inscription of high-contrast device symbolization.

Further shown in FIG. 9 is a plurality of insular mesas as contact to plate 900. The mesas designated 904 are in the first plate section 901, and the mesas designated 905 are in the second plate section 902. In the device example of FIG. 9, the insular mesas are arrayed linearly along one perimeter portion of plate 900. Each insular mesa 904 and 905 rises from second plate surface 902 and is composed of the same metal as the plate. FIG. 9 illustrates that the mesas 904 and 905 have a flat top 904a and 905a, respectively; the plurality of the mesa tops or surfaces 904a and 905a lie in a plane, which herein is referred to as the third surface of the packaged power FET.

FIG. 9 shows a power FET chip 910 assembled on the flat second plate surface 900b of metal plate 900. The attachment layer 920 may be continuous if the attach material is insulating; on the other hand, it has to be in two sections analogous to the plate sections, if it is electrically conductive; the latter embodiment is illustrated in FIGS. 9 and 10. In the assembly of FIG. 9, chip 910 has a pair of terminals attached to the plate sections; the terminals are designated 911 and 912, indicated by dashed lines, and located on the first side 910a of the chip. Terminal 911 is attached to plate section 901, and terminal 912 is attached to plate section 902; the attachments are evident in FIG. 10. In many FET devices, terminal 911 is the source terminal, and terminal 912 is the gate terminal; however, as discussed below, in other devices terminal 911 may be the drain terminal. It should be pointed out that it is preferred to place the gate terminal 912 in chip locations of low thermomechanical stress, such as close to the center of the chip, or close to the middle of a chip side. The single terminal 913 un-attached to the plate is on the second transistor side 910b. In many FET devices, terminal 913 is the drain terminal; however, as discussed below, in other devices terminal 913 may be the source terminal.

In the package example of FIG. 9, plate 900 has a linear metal ridge 903 extending along a perimeter of plate 901. Ridge 903 has a flat top 903a, like the mesas have, and a height equal to the height of the mesas. As a consequence, the surface 903a of ridge 903 is in the same plane as the surfaces 904a and 905a of the mesas and thus belongs to the third surface of the packaged power FET. The long narrow elevation 903 is raised from second plate surface 900b like the mesas 904 and 905; ridge 903 is made of the same metal as the plate. The purpose of ridge 903 is to protect the assembled semiconductor device; consequently, the height of ridge 903 is, in the preferred embodiment, equal to the height of the assembled device. In other package examples, the plate may have no ridge or more than one ridge; for example, there may be a ridge along each perimeter side, forming a frame.

As mentioned, plate 900 and thus mesas 904 and 905, and ridge 903, are preferably metallic, for example made of copper or aluminum. It is advantageous for many device applications to have the plate metal in a solderable metallurgical configuration. As an example, the plate metal surface may be covered by one or more layers of solderable metal, such as a layer of nickel followed by an outermost layer of palladium or gold.

Since the metal plates for most products are fabricated in sheet or strip form, the discrete plate is singulated from the strip by a separation technique such as sawing or punching (see FIG. 4). Consequently, all separated sides 900c of plate 900 show marks of the separation technique, such as saw marks.

In the step of conductively attaching chip terminals 911 and 912 to second plate surface 900b, the conductive attach material is selected from a group including adhesive polymeric compounds such as a silver-filled epoxy formulation, solder alloys such a tin-silver eutectic or a gold-germanium eutectic, and adhesive pastes with conductive filler particles such as carbon nano-tubes. For reasons of manufacturability and device reliability, it is preferred to assemble chip 910 so that the surface of terminal 913 is substantially (i.e., within ±12 μm) coplanar with the coplanar surfaces 905a and 903a. If the goal of coplanarity is difficult to manufacture, the protection of the chip favors a configuration, wherein the surfaces 905a and 903a are slightly higher than the surfaces of terminal 913.

Figure 11:
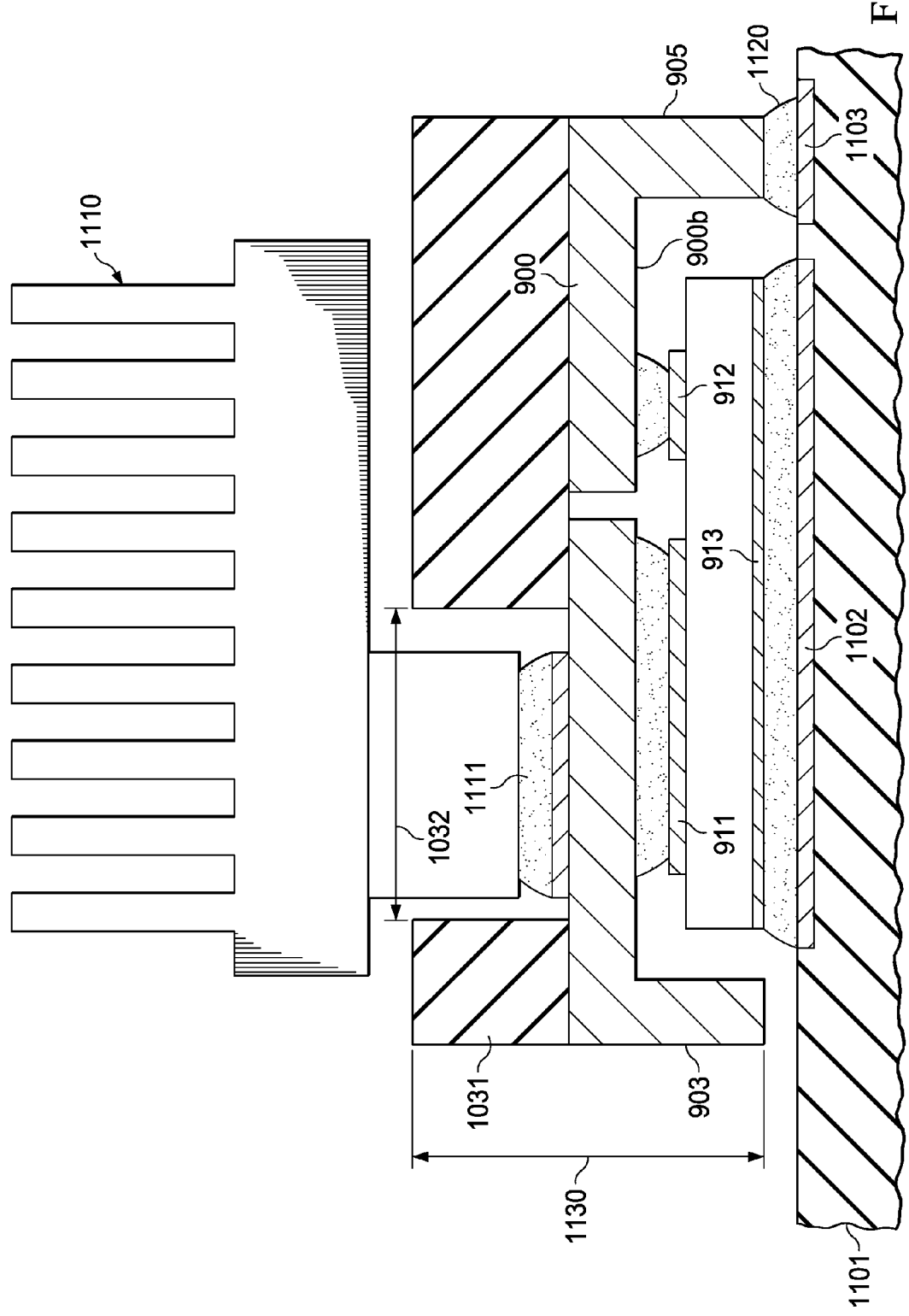
FIG. 11 shows a schematic cross section of the power FET of FIG. 10 after the packaged transistor has been attached to a PCB. In addition, a finned heat sink has been attached to the first plate section connected to the source terminal.

In the attachment of the packaged power FET to a substrate or printed circuit board 1101, see FIG. 11, the pre-assembled plate 900, backed by insulating member 1031, is flipped so that second plate surface 900b faces the substrate. The mesas 904 and 905 as the contacts of plate 900 can then be conductively attached (for instance by solder 1120) to respective pads 1103 of the substrate 1101. Since for many applications the terminal 912 represents the gate of the FET, the structure of FIG. 11 may be referred to as the "gate down" assembly. In FIG. 11 as well as FIG. 10, mesas 904 are not shown. The attachment step for mesas 904 and 905 is preferably performed in one process step together with conductively attaching FET terminal 913 to its respective substrate pad 1102. It is optional to also conductively attach ridge 903 to the substrate in the same process step.

Using the thickness measurements of piece parts quoted in conjunction with the gate-down configuration of FIG. 5, which resulted in a height 510 between about 110 and 350 μm for assembled packaged FET, an analogous height 1130 for the gate-up configuration of FIG. 11 needs to add the thickness of the member 1031. Dependent on the selection of the material (plastic film, molded layer, board, etc.), the thickness of member 1031 is in the range from about 100 to 800 μm. Consequently, the total height 1130 of the packaged gate-up FET of FIG. 11 is between about 210 and 1150 μm.

While the package design of the invention passes the electrical power and signals for the FET through the attached terminals to the PCB, the thermal energy of device operation can be effectively passed from the chip to a heat spreader and heat sink 1110 by the modification shown in FIG. 11 (a similar modification has been mentioned in conjunction with FIG. 5). Fin-equipped heat spreader 1110 can be attached, preferably by solder 1111, directly to metal plate 900 by creating an opening 1032 through insulating member 1031. Preferably, opening 1032 and thus heat spreader 1110 are aligned with terminal 911.

Figure 12:
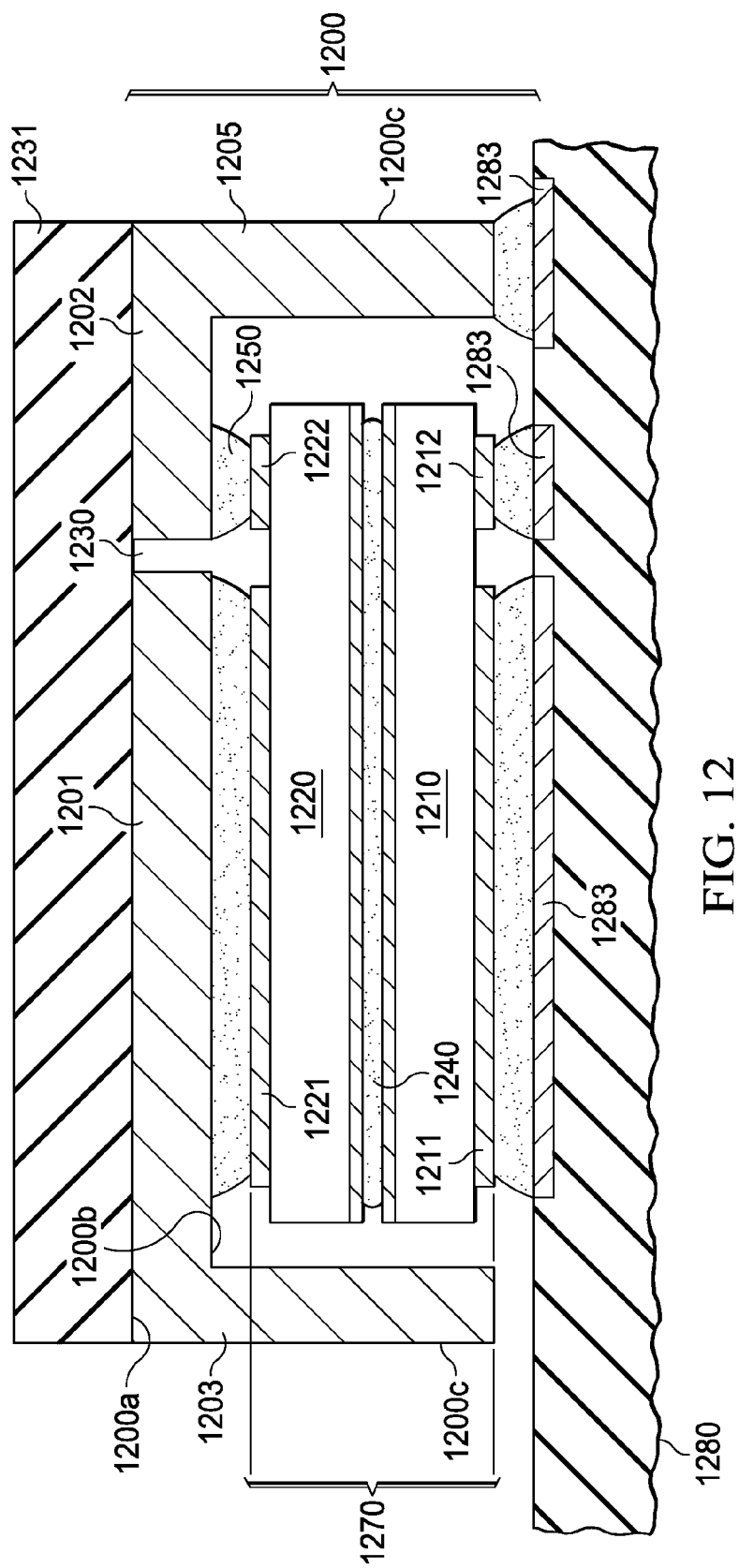
FIG. 12 illustrates a schematic cross section of an exemplary embodiment of a first and a second FET assembled as a vertical stack: The drain terminal of the first transistor is connected to the source terminal of the second transistor. The vertical stack is attached to the plate sections so that the source terminal of the first transistor contacts the first plate section and the gate terminal of the first transistor contacts the second plate section; the drain and gate terminals of the second transistor are connected to the PCB.

FIG. 12 illustrates another embodiment of the invention, namely a system including the assembly and packaging of a vertical stack of two power FET chips. The embodiment builds on the structure displayed in FIG. 10, wherein the terminal pair on one chip surface is packaged on a metal plate separated into two sections, and the single terminal on the other chip surface remains available for further assembly, such as the assembly onto a PCB. The embodiment of FIG. 12 includes a metal plate 1200, which has sides with marks 1200c of the singulation process, such as sawing marks. The plate further has a flat first surface 1200a and a parallel second surface 1200b. Plate 1200 is separated into a first section 1201 and a second section 1202 spaced apart by a gap 1230. Plate 1200 has on the second surface 1200b at least one insular mesa of the same metal in each section, the mesa is raised from the second plate surface 1200b; in the example of FIG. 12, mesa 1205 of the second section is shown, while the analogous mesa of the first section is not shown. FIG. 12 further depicts insulating member 1231, which adheres to the first plate surface 1200a, bridges the gap 1230 and thus physically couples the first section 1201 and the second section 1202 together.

In the example of FIG. 12, a vertical stack 1270 of two power FET chips 1210 and 1220 is attached to the plate. Each FET has a pair of terminals on the first chip surface and a single terminal on the second chip surface. The pair of terminals of chip 1210 is designated 1211 and 1212 respectively; the terminal pair of chip 1220 is designated 1221 and 1222 respectively. The single terminals of chip 1210 and chip 1220 are attached to each other to form common terminal 1240. In the example of FIG. 12, common terminal 1240 does not need to be accessed (in contrast, in FIGS. 13 and 14 common terminal 1240 needs to be accessed). The pair of terminals 1221 and 1222 is conductively attached to plate 1200 so that terminal 1221 contacts plate section 1201 and terminal 1222 contacts the second plate section 1202. In this manner, a packaged vertical chip stack 1270 is formed. As mentioned above, a preferred method of attachment is by soldering; an alternative method uses a conductive adhesive. An example of an attachment material is designated 1250 in FIG. 12.

FIG. 12 further illustrates the assembly of the packaged vertical chip stack onto an insulating substrate 1280, which has a plurality of contact pads 1283. The terminal pair 1211 and 1212, which is not used for the attachment of the stack to plate 1200, is now contacting respective pads 1283 of substrate 1280. In addition, at least one insular mesa of each plate section, such as mesa 1205, is attached to a respective substrate pad. It is optional to further attach ridge 1203 to the substrate; such attachment, not shown in FIG. 12, may be advisable to release stress, reduce warping, or hermetically encapsulate the chip stack.

In the example of FIG. 12, the insular mesa of plate section 1202 is shown and designated 1205; plate section 1202 may have more than just one insular mesa. On the other hand, the at least one insular mesa of section 1201 is not shown in FIG. 12.

The exemplary vertically stacked dual FET illustrated in FIG. 13 differs from the example in FIG. 12 with regard to the accessed common terminal 1303. The extended access allows the connection, for example by soldering, of the common terminal 1303 to a contact pad 1384 of the PBC. In this fashion, the extended access realizes the dotted connection 751 depicted in FIG. 7. In the preferred embodiment, the operational heat generated by the packaged vertical chip stack may be transferred away from the stack by an opening in the member as depicted in FIG. 11 and dissipated by a thermally conductive heat spreader similar to the spreader illustrated in FIG. 11.

As FIGS. 12 and 13 illustrate, it is a technical advantage of the invention that the package structure is flexible to accommodate to the footprint of the PCB contact pads. Consequently, the package of the invention lends itself to product standardization. As another advantage, the chip or stack assembly onto the plate can create near co-planarity of the package so that the package assembly onto the PCB can be achieved within the tolerance window of the attachment materials (such as solder thickness).

Figure 14:
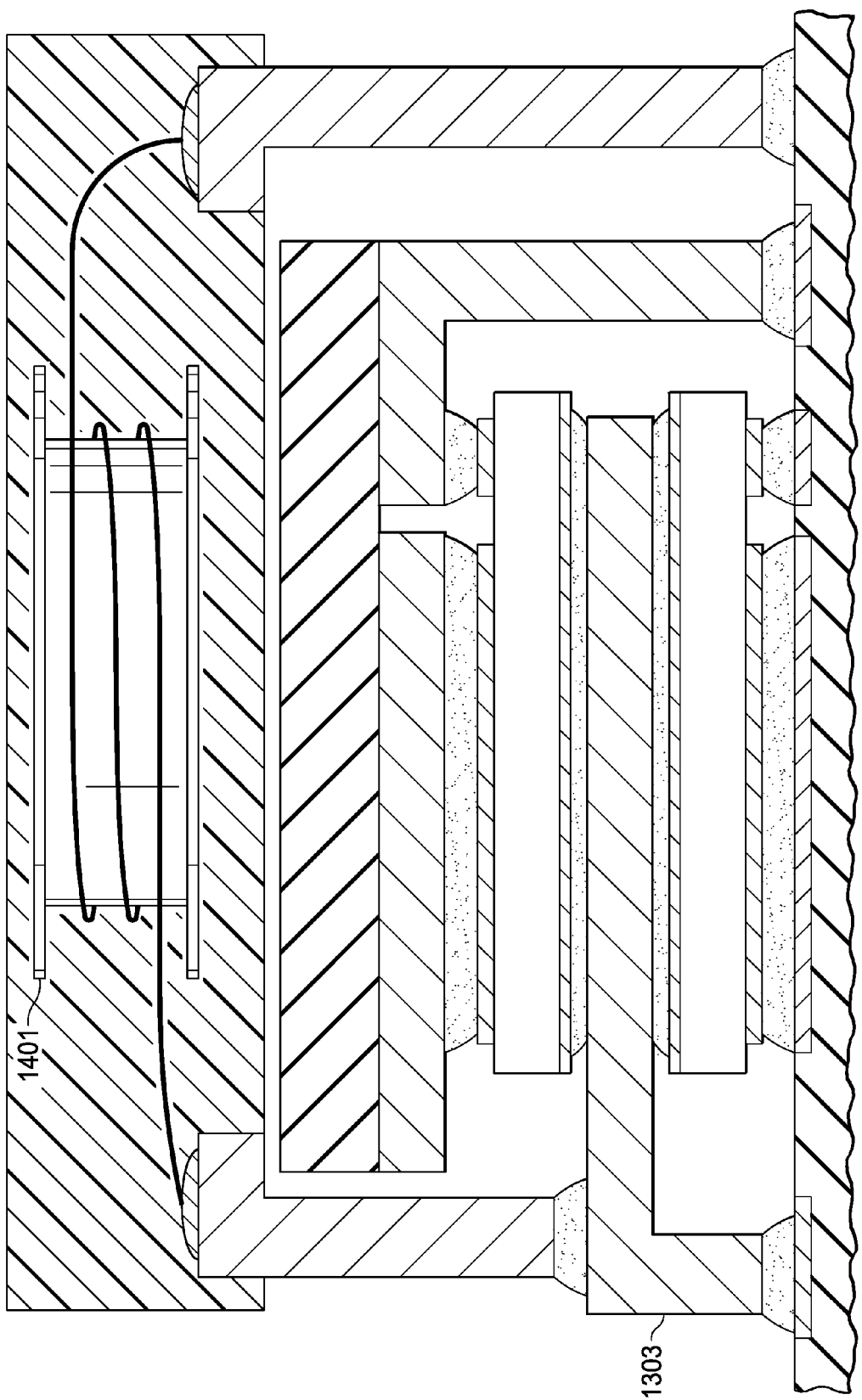
FIG. 14 illustrates a schematic cross section of vertically stacked FETs of a Half Bridge with an external inductor connected to the common terminal and vertically stacked on the transistor stack.

FIG. 14 depicts a configuration, which utilizes the extended common terminal 1303 to provide the physical support for vertically stacking and attaching an inductor 1401 in close proximity to the two stacked and packaged FET chips. The resulting vertically stacked, small footprint Half Bridge exhibits the three components of two FETs and an inductor in a tightly coupled configuration, where the complexity is moved into the domain of semiconductor packaging with its high capability. The result is a significantly improved electrical performance of the Half Bridge circuitry compared to the conventional practice, wherein the three devices are housed in three different packages coupled by traces on the PCB, which a system designer has to lay out and which are known to be large, size-inefficient, and expensive. With the inductor 1401 fully integrated with the transistors, FIG. 14 represents a high-efficiency realization of the Half Bridge diagram of FIG. 7 including the inductor 750.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to bipolar transistors and devices with any type of semiconductor chip; further, the invention applies to horizontal assembly on a common metal plate as well as to vertical chip stacks of various type devices.

As another example, the method can be extended to render the chip stack assembly as a fully hermetic package by extending the metal ridge into a complete a frame around all four sides of the stack; the frame can be hermetically attached to the metal plate by soldering the frame to the plate. When the assembly is performed under a controlled atmosphere, the trapping of moisture and particulate contamination can be avoided in the hermetically sealed package, resulting in high device reliability.

As another example, an electronic component such as a capacitor, a diode, a filter, an ESD protection device, a precision resistor, and a sensor can be integrated with the "gate down" structure depicted in exemplary FIGS. 11 and 12. The integration can be accomplished by shortening or omitting the metal ridge (903 and 1203, respectively) and instead inserting the component, which is connected (for example by soldering) to the plate as well as to a respective substrate contact pad.

In yet another example, the materials and the thicknesses of the metal plate and the member can be selected as a function of the size of the chip or the chip stack so that specific product goals of the assembled package can be achieved such as final thickness, mechanical strength, minimum warpage, prevention of cracking, strong symbolization contrast, compatibility with pick-and-place machines, and minimum electrical parasitics. In addition, the starting metal of the plate may be roughened, or plated with metal layers (such as nickel, palladium, gold, and tin), to improve mechanical adhesion or solderablity.

It is therefore intended that the appended claims encompass any such modifications or embodiments.

I claim:

1. An apparatus comprising: a metal plate having a single flat first plate surface and a parallel second plate surface, the flat first plate surface ending in four sawed plate sides, the metal plate having on the second plate surface at least one mesa of the same metal, the at least one mesa raised from the second plate surface and includes a linear array of insular mesas; and a semiconductor chip having at least a pair of terminals on a first chip surface and at least one terminal on a second chip surface, the at least one terminal attached onto the second plate surface.

2. The apparatus of claim 1, in which the pair of terminals on the first chip surface and the at least one insular mesa are attached onto pads of a substrate.

3. The apparatus of claim 1, in which the plate has a rectangular perimeter.

4. The apparatus of claim 3, in which the linear array of mesas is located along one perimeter side of the rectangular plate.

5. The apparatus of claim 4, in which the at least one mesa further has a flat top.

6. The apparatus of claim 5, in which the metal plate further includes at least one linear ridge of the same metal along a plate perimeter side, the ridge raised from the second plate surface and having a flat top.

7. The apparatus of claim 6, in which the second plate surface, surfaces of the mesas, and a surface of the ridge have a solderable metallurgical configuration.

8. The apparatus of claim 7, in which the metallurgical configuration includes at least one layer of a solderable metal.

9. The apparatus of claim 8, in which the first plate surface further includes a layer suitable for device symbolization.

10. An apparatus comprising: a metal plate having a flat first surface and a parallel second surface, the first surface ending in four sawed plate sides, the plate separated into a first section and a second section spaced apart by a gap, the plate having on the second surface at least one mesa of the same metal in each section, the mesa raised from the second plate surface; an insulating member adhering to the first plate surface, bridging the gap and holding the first and second sections together; a vertical stack of two semiconductor chips, each chip having a pair of terminals on a first chip surface and a single terminal on a second chip surface opposite the first chip surface, the single terminals of both chips attached to each other; and one of the pair of terminals is attached to the metal plate so that one terminal of the pair contacts the first plate section and the second terminal of the pair contacts the second plate section, forming a packaged chip stack.

11. The apparatus of claim 10 further including a substrate attached to the pair of terminal pair un-attached to the plate and a mesa of each plate section.

12. The apparatus of claim 11 further including a terminal connected to the attached single terminals of both chips.

* * * * *